United States Patent [19]

Askary et al.

[11] Patent Number: 4,774,416
[45] Date of Patent: Sep. 27, 1988

[54] LARGE CROSS-SECTIONAL AREA MOLECULAR BEAM SOURCE FOR SEMICONDUCTOR PROCESSING

[75] Inventors: Farid Askary; Mohammad R. K. Farnaam, both of Santa Clara; Mehdi Balooch, Berkeley, all of Calif.

[73] Assignee: Plaser Corporation, Santa Clara, Calif.

[21] Appl. No.: 911,380

[22] Filed: Sep. 24, 1986

[51] Int. Cl.$^4$ .............................................. H05H 3/00
[52] U.S. Cl. .................... 250/492.2; 250/251
[58] Field of Search ........................... 250/251, 492.2; 156/643

[56] References Cited

U.S. PATENT DOCUMENTS 4,397,711  8/1983  Donnelly et al. ................... 156/643

OTHER PUBLICATIONS

Machiels et al., High Temperature Science 9, 3–25, 1977, pp. 3–25.
Siekhaus et al., Jrnl. of Vacuum Science and Technology, vol. 9, No. 2, Oct. 11–15, 1971, p. 955.
Balooch et al., LBL-19906 Preprint, Center for Advanced Materials, Jul. 1985, pp. 1–16.
Valentini et al., Rev. Sci. Instrum., vol. 48, No. 1, Jan. 1977, pp. 58–63.
Jones et al., Jrnl. of Applied Physics, vol. 40, No. 11, Oct. 1969, pp. 4641–4649.
Olander, Jrnl. of Applied Physics, vol. 40, No. 11, Oct. 1969, pp. 4650–4657.
Olander et al., Jrnl. of Applied Physics, vol. 41, No. 7, Jun. 1970, pp. 2769–2776.
Olander et al., Jrnl. of Applied Physics, vol. 41, No. 11, Oct. 1970, pp. 4388–4391.
Olander et al., Entropie, No. 30, Nov.–Dec. 1969, pp. 42–47.
Donnelly and Flamm, Solid State Technology, Apr. 1981, pp. 161–166.
Donnelly et al., Solid-State Science and Technology, vol. 129, No. 11, Nov. 1982, pp. 2533–2537.
Olander et al., Jrnl. of Chemical Physics, vol. 67, No. 8, Oct. 15, 1977, pp. 3549–3562.

Primary Examiner—Craig E. Church
Assistant Examiner—Jack I. Berman
Attorney, Agent, or Firm—Fliesler, Dubb, Meyer & Lovejoy

[57] ABSTRACT

A large cross-section molecular beam source for the controlled delivery of a reactant species to provide deposition or etching over a generally large cross-sectional surface area of a substrate is described. The apparatus includes a source of the reactant species, typically as a gaseous material, a microchannel array for providing a directionalized, low divergence molecular beam of the reactant species having a cross-sectional dimension directly comparable to that of the substrate. The apparatus further includes a substrate mount that maintains the substrate so as to allow the direct impingement of the columnarized molecular beam on the wide area surface of the substrate. The reactant species source, microchannel array and substrate mount are housed within a vacuum chamber adapted to maintain a vacuum sufficient to enable the formation of the directionalized molecular beam of the reactant species upon its passing through the microchannel array.

36 Claims, 2 Drawing Sheets

LARGE CROSS-SECTIONAL AREA MOLECULAR BEAM SOURCE FOR SEMICONDUCTOR PROCESSING

FIELD OF THE INVENTION

The present invention generally pertains to the fields of material and semiconductor processing and, in particular, to a large cross-sectional area molecular beam source utilized to deposit or etch away material at the surface of a semiconductor substrate.

BACKGROUND OF THE INVENTION

A wide variety of techniques for depositing and etching layers of material at the surface of a substrate are known. The deposition techniques include liquid and vapor phase chemical deposition, epitaxial crystal growth, ion sputtering and molecular beam epitaxial growth, to name a few. The etching techniques include wet etching, plasma etching, ion-assisted etching, laser drilling and physical sputtering, to name a few. Each of these techniques possess advantages and disadvantages that may vary depending on the circumstances in which the technique is used. The advantages and disadvantages include low deposition and removal rates, non-uniformity over large surface areas, isotropic/anisotropic effects, induced crystal lattice damage and substrate surface contamination.

One criteria often encountered in selecting any particular deposition or removal technique is commercial viability. Typically, the technique must act effectively with commercially acceptable substrate diameters, processing rates and materials. Currently, most commercial material substrate diameters exceed one inch.

Another criteria is the resultant surface morphology and associated defect density. Since protuberances, contaminants and crystal lattice defects may act as undesirable points of heightened or non-uniform processing activity, the deposition or etching technique should provide an acceptably smooth, clean and undamaged surface.

Conventional effusive source molecular beam techniques represent a technology that, in general, meets many of the above criteria. Conventional molecular beams are created by the effusive release of a reactant species into a highly evacuated chamber at a point directly opposing a typically flat substrate surface. Due to very low beam gas pressure, the individual particles of the effusively released reactant species largely maintain their respective initial thermal velocity and divergent directions of travel. The effusive release of the reactant species under such circumstances has been well characterized as having a cosine-angular distribution. The typically flat substrate surface therefore receives the molecular beam with a non-uniform flux over the beam-incident portion of its surface. The non-uniformity in incident flux produces a corresponding non-uniform deposition or etching of the substrate surface, though such non-uniformities can be reduced by mechanically displacing the substrate with respect to the beam. However, a significant detracting consequence of the effusive nature of molecular beams is that the total flux of the beam is quite low, particularly as compared to other techniques that utilize gas flows at much greater relative pressures.

One such other technology, utilizing a nozzle beam generated from a high pressure source, realizes a very high total-beam flux. A nozzle beam is formed when the source gas is injected into a vacuum chamber, under extremely high pressure to effectively convert the random thermal motion of the source gas molecules to directed translational motion. The resultant nozzle beam is monoenergetic and has a directionally peaked angular distribution. The major drawback limiting the effective use of nozzle beam technologies is the very large primary vacuum pumping system required to handle the substantial gas load that must be continuously evacuated from the chamber. Further, the sharp angular distribution results in a more non-uniform beam intensity on the substrate as compared to a conventional effusive beam.

In an effort to improve on molecular beam technology, some research has been done to characterize a multichannel molecular beam source. The effort undertaken was to characterize the angular and velocity distributions of an effusive gas emitted from a glass tube bundle used as the beam source. The source bundles contained less than about 4000 channels with each channel being 0.025 cm long and 11 micrometers in diameter. The micro-channels where packed into a bundle of only about 1 millimeter diameter or less.

These multichannel source characterization efforts were primarily for the fundamental beam surface scattering studies of gas-solid interactions. In these experiments, the primary molecular beam interacts with another beam or a surface before detection. The interaction zones in these studies have a desirably, well-defined cross-sectional area of about 1 millimeter$^2$ or less. These studies require accurate knowledge of the intensity, angular and velocity distributions of the gas molecules injected into the interaction zone.

In characterizing the multichannel sources, the most well-defined zone was obtained with a molecular beam utilizing thin-wall orifices operated at source pressures low enough to ensure free molecular flow conditions. The multichannel sources where studied to relate the size and general structure of the microchannel source to the total flow and angular/velocity distribution beam that they produce. As a result, those multichannel sources studied were generally characterized with regard to their predicted angular/velocity distribution function. However, the experimental results, for pressures higher than that for free molecular flow associated with the diameter of the channels tested, were not accurately in agreement with the available theoretical predictions. Therefore, multichannel sources have generally not been considered suitable for fundamental studies as compared to single channel source effusive beams.

A purpose of the present invention is, therefore, to realize a large cross-sectional area, low-divergence, directionalized molecular beam for use in either depositing or etching material at the surface of a substrate.

SUMMARY OF THE INVENTION

The present invention provides an apparatus for the controlled delivery of a directionalized, large cross-sectional area molecular beam of a reactant species to the surface of a substrate. The apparatus preferably includes a large area microchannel array for directing a low-divergence molecular beam formed of the reactant species to the surface of the substrate. In the preferred embodiment of the present invention, the microchannel array has a cross-sectional area approximately equal to or greater than the cross-sectional area of the surface of the substrate to be processed.

The preferred embodiment of the apparatus further includes a substrate mount that maintains the substrate so as to allow the direct impingement of the directionalized molecular beam onto the surface of the substrate. The terminal end of the reactant species source, microchannel array and substrate mount are housed within a vacuum chamber adapted to maintain a vacuum sufficient to enable the formation of a directionalized molecular beam of the reactant species as it passes through the microchannel array.

The present invention maintains the advantages of prior, effusive molecular beam techniques.

Further, the present invention has the advantage of alternately providing for etching as well as deposition of material uniformly over the surface of the substrate using a wide variety of source materials. Additionally, a preferred embodiment of the present invention permits the use, simultaneously or sequentially, of two or more source materials.

Additionally, the present invention utilizes a limited amount of gaseous material and operates below the transition pressure above which turbulent or viscous gas flow occurs. In the present invention, substantially all of the gaseous material is directed to impinge onto the surface of the substrate thereby obtaining an efficient use of the gaseous material and the vacuum equipment.

As another advantage, the present invention is substantially insensitive to the design of the molecular beam vacuum chamber and the gas chamber at the inductor surface of the microchannel array. The highly directional delivery of the reactive species to the surface of the substrate obtains highly uniform feature definition and extremely small feature sizes. In particular, the highly directional delivery can be utilized to minimize undercutting in etching applications.

Yet another advantage of the present invention is that the directionalized molecular beam provided has a uniform intensity, or flux density, over the entire cross-sectional area of the beam. Further, the total beam intensity can be accurately varied over several orders of magnitude.

These and other attendant advantages of the present invention will become apparent and readily appreciated as the same becomes better understood by reference to the following detailed description of the invention when considered in conjunction with the accompanying drawings.

DETAILED DESCRIPTION OF THE INVENTION

Figures 1, 2B:
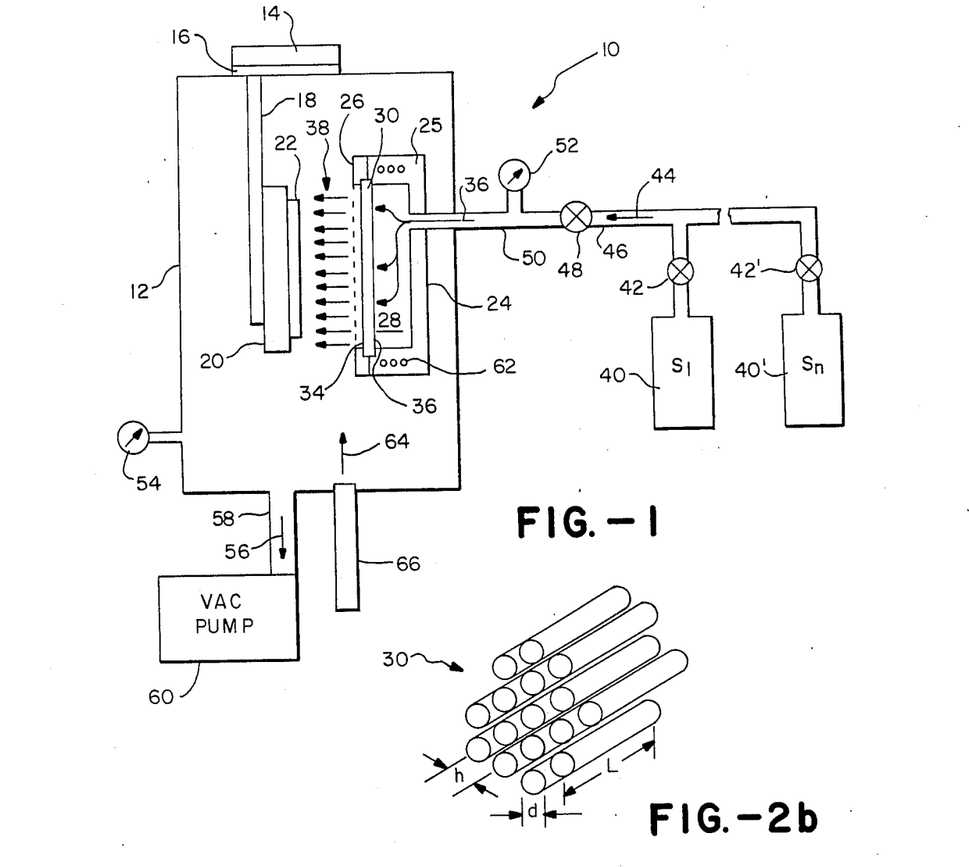
FIG. 1 is a cross-sectional view of a vacuum molecular beam chamber, substrate mount and wide area molecular beam source constructed in accordance with a preferred embodiment of the present invention.
FIG. 2b is a perspective view of an illustrative portion of a microchannel array plate constructed in accordance with the present invention.

In FIG. 1, a reactor system 10 employing a wide area molecular beam source, constructed in accordance with the present invention, is shown. The reactor system 10 includes a vacuum chamber 12 with an access port nominally sealed by an access port closure vacuum fixture 14. Coupled to the fixture 14 is a substrate mount assembly, including a base 16, a mount arm 18 and a substrate mount 20. A highly directional, low divergence beam 38 of a reactant species is provided to the exposed, large cross-sectional surface area of a substrate 22. The substrate mount 20 provides for the physical support of the substrate 22 with a high thermal conductivity connection between the mount 20 and semiconductor substrate 22. This allows the mount 20 to further provide for the inductive or resistive heating of the substrate 22 to a predetermined temperature. The temperature is selected based on considerations including the nature of the substrate 22 material, the reactant species 38, the surface reaction desired and the thermal stability of any masking material, if any present on the surface of the substrate. Substrate heating is controlled to achieve exposed substrate surface temperatures at the predetermined level, typically in the range of about room temperature to 700° centigrade. For example, the specific range for GaAs etching is between about room temperature and 250° centigrade, with the choice of temperature further determined upon selection of the etchant, the specific photoresist or other masking material used, and the rate of etching desired.

In accordance with the present invention, a large cross-sectional area molecular beam 38 of the reactant species is provided from a large cross-sectional area source fixture 24. The molecular beam source fixture 24 includes an inductor chamber housing 25, a microchannel array plate 30 and a plate retention ring 26 that seals the edge of the plate 30 to the inductor chamber housing 25. An inside or inductor surface 32 of the microchannel array plate 30 completes an enclosed inductor chamber 28 within the inductor chamber housing 25.

Figure 2A:
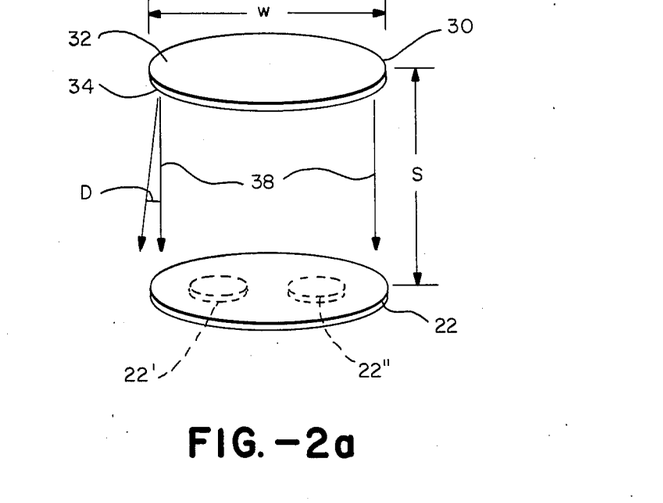
FIG. 2a is a simplified perspective view of a microchannel array plate positioned over a substrate surface of generally like cross-sectional area.

As schematically shown in FIG. 2a, the microchannel array plate 30 is preferably aligned with respect to the substrate 22 such that the active emitter surface of the microchannel array plate 34 is plane parallel to and directly opposing the exposed surface of the substrate 22.

Referring again to FIG. 1, a high pressure reactant species 40 is provided from any one or combination of reactant sources by release via respective source pressure valves 40, 40', 42, 42' into a high pressure gas tube 46 terminated by a pressure valve 48. The reactant species 44, therefore, can be readily created as a mixture of one or more active materials. However, the specific combination of multiple active materials must be such that they are mutually non-interactive when combined as the reactant species 44 for the continuum of pressures and temperatures experienced by the reactant species from the point of their mixing at least until emitted as the beam 38.

The pressure valve 48 is typically either a mass flow control or leak valve. The high pressure reactant species 44 is passed and reduced in pressure by the pressure valve 48 to provide low pressure reactant species 36. A low pressure gas tube 50 coupled from the pressure valve 48 to the inductor chamber housing 25 for the transfer of the low pressure reactant species 36. The reactant species 36 then passes through the microchannel array plate 30 with another reduction in pressure to provide the highly directionalized, low divergence beam 38.

In accordance with the present invention, the low pressure reactant species 36 may be specifically conditioned while in or shortly after leaving the inductor chamber 28. The manner of achieving conditioning is varied, but is generally characterized as activating the reactant species by dissociation into selected component parts, excitation or ionization, or a combination thereof. In particular, thermal activation of the reactant species 36 can be achieved by heating the reactant species 36 within the inductor chamber 28. This manner of conditioning the reactant species 36 can be achieved by inductively heating the inductor chamber housing 25 through the use of inductor coils 62. Alternately, the reactant species 36 can be activated by introducing a laser beam 64 from laser 66 into the reactor chamber 12 directed across the path of the beam 38 to cause radiation enhanced activation of the reactant species through dissociation into component parts, ionization or excitation. The dissociation of the reactant species is preferably into component parts having substantially different masses to retain the directionalized nature of the molecular beam. The laser beam 64 is scanned or otherwise spread uniformly by the laser 66 to uniformly expose a full-width cross-section of the beam 38 plane perpendicular to the path of the beam 38. Another manner of activating the reactant species is achieved by applying an ionizing electric field to the reactant species 36 within the inductor chamber 28 or the beam 38. Conditioning the reactant species 36 in any of these manners can yield radicals or ions that are more reactive with the substrate surface than the unconditioned reactant species 36.

A pressure gauge 52 is provided on the low pressure gas tube 50 to monitor the gas pressure within the inductor chamber 28. A second gas pressure gauge 54 is coupled to the reactor chamber 12 to monitor the base pressure within the reactor chamber 12. The reactor system 10 includes a high vacuum pumping system 60 coupled to the reactor chamber 12 by tube 58. The pumping system 60 provides for the initial chamber 10 pump-down to a base pressure and the subsequent maintenance of a background pressure by the continuous removal of spent reactant gasses 56, including reaction products from the surface of the substrate 22. A base pressure of $10^{-6}$ to $10^{-8}$ Torr is preferred as the initial pump down pressure. During operation, a background pressure of approximately $5 \times 10^{-6}$ Torr or less has been found satisfactory.

A small section of the microchannel array plate 30, constructed in accordance with a preferred embodiment of the present invention, is shown in FIG. 2b. The microchannel array plate 30 preferably includes a plurality of hollow, cylindrical channels closely packed together with their respective major cylindrical axis aligned parallel one another. The intersection of the microchannels and the emitter surface of the microchannel array plate 30 should be less than 20°, and preferably less than 10°, off normal to the emitter surface 34. The cylinder walls and the material interstitially coupling the microchannel cylinders is preferably of a highly stable, non-reactive material such as quartz. In one preferred embodiment, the plate is constructed by fusing together a large number of quartz coated cylindrical fibers to obtain a solid structure. The central cylindrical fibers are then dissolved away with an appropriate solvent to leave microchannels having a desired internal diameter. The resulting structure is then cleaved at the ends to yield a plate having hollow cylindrical microchannels of the desired length oriented substantially perpendicular to the cleaved surfaces. Alternately, microchannel array plates generally suitable for use in conjunction with the present invention may be obtained from Galileo Electro-Optics Corporation, Galileo Park, Sturbridge, Mass., as Part Number 1330-9720-MCP-075, 0° Bias, No Etching, No Test. The cross-section of the cylindrical microchannels need not be circular and, as a consequence of manufacturing, typically are not. Indeed, the microchannels could have a cross-section approaching a rectangle, after processing if not before, and still be equivalently used. Thus, all such microchannels will be generically described as cylindrical.

Preferably, the cross-sectional area of the beam 38 is chosen to closely match, in geometry and area, the surface area of commercially used semiconductor substrates. The cross-sectional area of the beam 38, however, could range from somewhat smaller to quite larger than that of the substrate. In fact, the cross-sectional area of the beam 38 can be sufficiently larger to allow simultaneously exposure and equivalent processing of several substrates 22', 22" by a single beam 38 as is generally indicated in FIG. 2a. Accordingly, the active emitter surface 34 of the microchannel array plate 30 is provided with a gross diameter of from about one half inch to eight inches or greater. While the various detail dimensions of the microchannel array plate are generally dependent on the particular application of the present invention (i.e., the nature of the reactant species 36, including its temperature and pressure, and the desired flux density of the beam 38), the number of microchannels will be generally within about $10^4$ to $10^8$ microchannels per square centimeter. The internal channel diameter "d" of each microchannel is preferably less than the mean free path "λ" of the reactant species 36 at the pressure within the inductor chamber 28. The choice of the length "L" of each microchannel is constrained by gas flow or conductance considerations as the reactant species passes through the microchannels, as well as the limit of the largest acceptable directional divergence "D" of the reactant species upon leaving the emitter ends of the microchannels as generally indicated in FIG. 2a. The relationship of the Clausing factor "K" (a measure of conductance) to the dimensions of the microchannel is approximated by Equation 1:

$$K \simeq \frac{1}{1 + 3L/4d} \qquad \text{Eq. 1}$$

while the relationship of the divergence "D" of the beam to the microchannel dimensions is given, in general, by Equation 2:

$$D \alpha \frac{d}{L} \qquad \text{Eq. 2}$$

thus, for preferred embodiments of the present invention, the mean free path "λ" of the reactant species 36 is preferably the same or less than the length "L" of the microchannels while the microchannel diameter "d" is one to two orders of magnitude less than the length "L". The preferred center-to-center spacing "h" of the microchannels, for molecular beam embodiments of the present invention, within one order of magnitude of a microchannel diameter "d" results in a uniform flux density molecular beam over a beam cross-sectional area plane parallel to the active emitter surface area of the microchannel array plate 30. For supersonic nozzle-tipped microchannel embodiments of the present invention, the microchannel spacing "h" is determined ultimately by the capacity of the pumping system 60 as a limit on the number of evenly spaced microchannels that can be accommodated. Finally, the distance "s" between the multichannel array plate 30 and the surface of the substrate 22 is preferably equal to or within one order of magnitude of the diameter "w" of the multichannel array plate 30. These preferred relationships result in a divergence "D" that is readily acceptable for the production of a low-divergence large cross-sectional area molecular beam over the preferred gross diameter range of multichannel array plates 30 while effectively smoothing out the multiple microchannel sources of the reactant species.

The present invention obtains a predictable and repeatable rate of depositing or etching material at the surface of the substrate 22 as a result of the direct presentation of the low divergence, large cross-sectional area beam 38 to the exposed surface of the substrate 22. Although there is a comparatively high total flux density of the wide area molecular beam 38 onto the exposed surface of the substrate 22, relative to conventional effusive molecular beams, no turbulence related effects have been observed, let alone determined to affect the uniform delivery of the beam to the exposed surface of the substrate. Thus, a high uniformity in the reaction rate over the entire substrate surface is realized. Further, in accordance with the present invention, the surface reaction rate achieved is a direct function of the total flux density of the impinging molecular beam. The beam total flux density, in turn, is a readily controlled variable that can be varied over several orders of magnitude by altering the total amount of the reactant species 44 originally sourced. Consequently, the net surface reaction rate "r" applicable with respect to the present invention, at least to a first approximation, is given by Equation 3:

$$r \simeq \frac{\alpha F}{\eta} \left( \frac{A}{\sec} \right) \qquad \text{Eq. 3}$$

where "$\alpha$" is the reaction probability of the reactant species 38 interacting with the surface of the substrate 22 as a further function of temperature, "F" is the flux density of the large cross-sectional area beam and "$\eta$" is the reaction ratio of the reactant species to the substrate material, normalized for a one angstrom thick layer of the substrate material, one square centimeter in area. Assuming the background pressure within the reaction chamber 12 to be negligible, the flux density of the large cross-sectional area beam 38 is a function of the pressure within the inductor chamber 28, at least to a first approximation, as given by Equation 4:

$$F \simeq \frac{1}{4} \left( \frac{P}{kT} \right) v \qquad \text{Eq. 4}$$

where "P" is the pressure of the reactant species 36, "k" is Boltzmann's constant, "T" is the substrate surface temperature and "$v$" is the average thermal velocity of the low pressure reactant species 36.

Finally, for the present invention, the net surface reaction rate "r", with respect to the pressure of the low pressure reactant species 36, the diameter of the microchannels and the active surface area of the emitter surface 34 of the microchannel array plate 30, to at least a first approximation, is provided by Equation 5:

$$r \simeq \left( \frac{\alpha}{\eta} \right) N \left( \frac{\pi}{4} d^2 \right) K \left( \frac{v}{4kT} \right) P \qquad \text{Eq. 5}$$

$$\simeq \frac{\alpha}{\eta} \left( \frac{\pi}{2\sqrt{3}} d^2/h^2 \right) \left( \frac{1}{1 + (3L/4d)} \right) \left( \frac{v}{4mT} \right) P$$

where "N" is the total number of microchannels making up the active emitter surface of the multichannel array plate.

Table 1 provides the experimental values for solving Equation 5 with reference to a gallium arsenide substrate 22 and a molecular chlorine reactant species beam 38 as actually utilized in carrying out the present invention.

TABLE I

| | |
|---|---|
| d = 25 µm | microchannel diameter |
| h = 32 µm | microchannel spacing |
| l = 100 µm | microchannel length |
| α = 0.05 | reaction probability at room temperature |
| η = 6.66 × 10⁴ | GaAs and Cl₂ system |
| v ≃ 3 × 10⁴ cm/sec | thermal velocity of Cl₂ at room temperature |

For the values given in Table 1 above, the resultant reaction rate, expressed by Equation 5, can be seen to be a direct function of the pressure within the induction chamber 28, at least to a first approximation.

Figure 3:
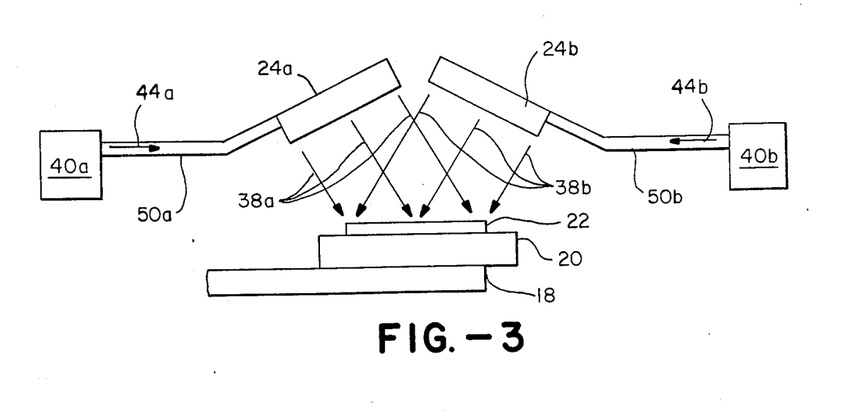
FIG. 3 is a simplified cross-sectional view of an alternate preferred embodiment of the present invention.

An alternate embodiment of the present invention is illustrated in FIG. 3. The details of the reaction chamber housing reactant species source and pumping subsystems are essentially the same as shown in FIG. 1. The embodiment of the present invention shown in FIG. 3 allows for the provision of sequential or simultaneous large cross-sectional area molecular beams 38a, 38b that carry respective reactant species to a common, exposed surface of the substrate 22. As before, the substrate 22 is mounted and heated to a predetermined temperature on the substrate mount 20. The mount 20 is maintained in position by the mount arm 18. Separate, large cross-sectional area beam fixtures 24a, 24b are provided such that their respective large cross-sectional area beams 38a, 38b impinge on the exposed surface of the substrate 22. The fixtures 24a, 24b provide beam cross-sections, taken plane parallel to the exposed surface of the substrate 22, that generally match the exposed surface area of the substrate 22. Each of the large cross-sectional area molecular beam source fixtures 24a, 24b may be provided with respective reactant species 44a, 44b, from respective conduction tubes 48a, 48b, ultimately from respective reactant species sources 40a, 40b. These sources 40a, 40b may contain different active material or be, in fact, the same source.

In the former case, the two distinct reactant species 40a, 40b are provided either sequentially or simultaneously. Repeated sequential provision of the reactant species 40a, 40b, in particular, may be advantageously utilized for the growth of extremely thin layers of distinctly different materials as would be appropriate in the fabrication of, for example, hyperabrupt junction semiconductor devices. Simultaneous provision of two distinct reactant species 40a, 40b may be necessary where the reactant species 40a, 40b are inter-reactive and, therefore, are not suitably mixed until suited as beams 38a, 38b. In this latter instance, the beams 38a, 38b are provided simultaneously to double the total flux density of the reentrant species delivered to the substrate surface.

Figure 4:
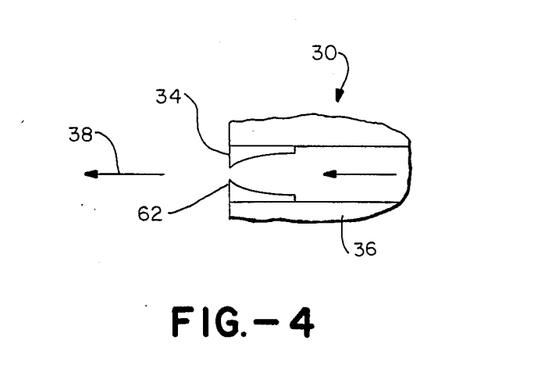
FIG. 4 is a partial cutaway view of a supersonic nozzle for use in an alternate embodiment of the present invention.

A contemplated alternate embodiment of the present invention includes a multichannel array plate 30 having nozzles in each microchannel at the emitter surface 34 of the plate 30. As generally shown in FIG. 4, a nozzle cross-sectional profile 62 is selected as one appropriate for the supersonic velocity emission of reactant species. A supersonic directionalized beam is formed as a result of a high induction chamber 28 pressure (up to several atmospheres) and a vacuum chamber background pressure of about $5 \times 10^{-6}$ Torr or less. The reactant species 38 expands from the induction chamber 28 into the reaction chamber through the plate nozzles 62 resulting in high translational energy along the axis of the nozzle 62 and a reduction in the random motion of the gas species associated with temperature. The overall effect is that the resultant supersonic beam has an angular divergence "D" that is much less and a total flux density much greater than that of conventional effusive source molecular beams. However, the total flux density of the resultant supersonic beam is far less than an equivalent single nozzle supersonic beam. Consequently, fully adequate, conventional pumping systems 60 can be used.

EXAMPLE

A gallium arsenide wafer substrate with a crystal orientation of <100> was uniformly etched over a substantially circular substrate surface having a diameter of approximately three inches. The apparatus utilized was substantially similar to the embodiment of the present invention illustrated in FIG. 1. The pertinent dimensions of the microchannel array plate 30 were as given in Table 1 above. The diameter of the active emitter surface was approximately three inches (approximately 45.6 cm$^2$) and contained approximately $4.45 \times 10^6$ microchannels. First, the gallium arsenide substrate was heated to a temperature of approximately 90 degrees centigrade. The sealed reaction chamber was evacuated to a base pressure of $2 \times 10^{-7}$ Torr. A leak type pressure valve 44 was then adjusted to obtain a closely estimated pressure of $1 \times 10^{-3}$ Torr of molecular chlorine in the inductor chamber 28. The orientation of the emitter surface of the microchannel array plate 30 was substantially plane parallel to and directly overlying the exposed surface of the gallium arsenide substrate. The substrate and microchannel array plate were separated by a distance of approximately 5 cm. At equilibrium during the chlorine etching of the gallium arsenide substrate surface, the background pressure within the reactor chamber was stable at $8 \times 10^{-6}$ Torr.

Following eight minutes of exposure to the chlorine molecular beam and subsequent removal of the substrate from the reactor chamber, a layer of 120 Angstroms of gallium arsenide was determined to have been uniformly removed over the entire three inch diameter substrate surface area. Thus, the experimentally determined etch rate of 15 Angstroms per minute is in generally good agreement with the rate predictable from Equation 6 (Equation 5 solved for the experimental values used):

$$r \simeq 20\, P \qquad \text{Eq. 6}$$

where "r" is in A/min and "P" is in milli Torr.

Thus, a large cross-sectional area molecular beam source suitable for use in both the deposition or removal of a uniform layer of material at a surface of a substrate has been described.

A number of modifications and variations of the present invention are possible in light of the above teachings. For example, alternate materials such as pyrolytic boron nitride or a nickel alloy may be employed in the construction of the microchannel array plate (the nickel alloy may be preferred to realize a thermally conductive plate that participates in the conditioning of the reactant species), substrates of silicon, germanium, indium phosphide and silicon carbide can be utilized in conjunction with reactant species including dichlorosilane, ammonia, phosphine and various organo-metallic compounds. Further, structural alterations such as the provision of a plurality of substrates mounted in opposition to respective wide area molecular beam source fixtures within a common reactor chamber are contemplated. It is therefore to be understood that, within the scope of the appended claims, the present invention may be practiced otherwise than a specifically described above.

What is claimed is:

1. Apparatus for performing semiconductor processing, said apparatus comprising:
   (a) a semiconductor substrate;
   (b) a reactant species; and
   (c) microchannel means for forming a molecular beam of said reactant species, said microchannel means including a plurality of microchannels for directionalizing said reactant species, such that said molecular beam has a large cross-sectional area with low divergence, and for directing said molecular beam to be incident on a surface of said semiconductor substrate.

2. The apparatus of claim 1 wherein said semiconductor substrate includes a layer of semiconductor material provided for the fabrication of semiconductor devices formed generally therein, wherein said microchannel means forms said molecular beam directed at a first angle with respect to said microchannel means, said microchannel means being oriented with respect to said semiconductor substrate such that said molecular beam is incident on the surface of said semiconductor substrate at a second angle.

3. The apparatus of claim 2 wherein said reactant species provides for the deposition or removal of material at the surface of said semiconductor substrate.

4. The apparatus of claim 3 wherein said plurality of microchannels includes a plurality of open microchannels that are mutually parallel aligned with respect to one another and that extend through said microchannel means, said plurality of microchannels being closely packed to form a plate having an emitter surface from which said molecular beam is emitted, and wherein said first angle is within about 20 degrees off normal to said emitter surface.

5. The apparatus of claim 4 wherein said plurality of microchannels includes a like plurality of nozzle emitters for forming said molecular beam.

6. The apparatus of claim 5 wherein each of said nozzle emitters includes a supersonic profile nozzle provided at the exit opening of a respective one of said plurality of microchannels.

7. An apparatus for forming a directionalized molecular beam, said apparatus comprising:
(a) a source of a reactant gas species;
(b) a microchannel plate having a large cross-sectional area for forming a low divergence molecular beam of said reactant gas species, said microchannel plate having inductor and emitter surfaces;
(c) chamber means for conducting said reactant gas species from said source to said inductor surface of said microchannel plate;
(d) a substrate including a semiconductor layer at a major surface of said substrate; and
(e) a substrate mount for supporting said substrate in the path of said low divergence molecular beam.

8. The apparatus of claim 7 further comprising means for conditioning said reactant gas species to provide an activated portion of said reactant gas species having an increased reactivity with respect to said substrate, said conditioning means conditioning said reactive gas species while said reactant species is present in said chamber means.

9. The apparatus of claim 7 further comprising means for conditioning said reactant gas species to provide an activated portion of said reactant gas species having an increased reactivity with respect to said substrate, said conditioning means conditioning said reactive gas species while said reactant species is present in said low divergence molecular beam.

10. The apparatus of claim 8 or 9 wherein said activated portion of said reactant gas species includes radicals, ions, dissociated reactant gas species components or excited reactant species.

11. The apparatus of claim 8 or 9 wherein said substrate includes a plurality of substrate components positioned on said substrate mount, each said substrate component including a semiconductor layer at a respective major component surface of said substrate.

12. The apparatus of claim 8 or 9 wherein said conditioning means provides for the transfer of radiant energy to said reactant species to activate said portion of said reactant gas species.

13. The apparatus of claim 9 wherein said conditioning means comprises:
(a) a laser for generating a laser beam; and
(b) means for directing said laser beam to irradiate said reactant gas species as they pass through a cross-section of said low divergence beam, said laser generating said laser beam at a sufficient intensity to realize radiation enhanced activation of a portion of said reactant gas species as they pass through said irradiated cross-section of said low divergence beam.

14. The apparatus of claim 8 wherein said conditioning means provides for the heating of said chamber means to create a source of thermal energy for transfer to said reactant gas species while said reactant gas species is passing through said chamber means.

15. The apparatus of claim 8 or 9 further comprising field means for generating an electromagnetic field through which said reactant gas species passes, said electromagnetic field being of sufficient intensity to excite said portion of said reactant gas species as they pass through said electromagnetic field.

16. The apparatus of claim 15 wherein said field means exposes a cross-section of said directionalized beam to said electromagnetic field.

17. The apparatus of claim 15 wherein said field means creates said electromagnetic field within said chamber means.

18. Apparatus for providing a plurality of low divergence, large cross-sectional area reactant gas beams, said apparatus comprising:
(a) sources of reactant gas species;
(b) a substrate having a major surface including a semiconductor layer;
(c) a plurality of microchannel plates for receiving said reactant gas species from said source and providing said reactant gas beams; and
(d) a mount for positioning said substrate such that said reactant gas beams are incident on the major surface of said substrate.

19. The apparatus of claim 18 wherein each said microchannel plate has an inductor and an emitter surface, wherein each said microchannel plate comprises a plurality of microchannels extending therethrough at a respective angle of less than about 20° off normal to said emitter surface and wherein said reactant gas beams are incident on said substrate at an angle of less than about 45° off normal to the major surface of said substrate.

20. The apparatus of claim 19 further comprising a plurality of inductor housings respectively coupled to said sources for receiving said reactant gas species, each said inductor housing forming a chamber over a respective said inductor surface.

21. The apparatus of claim 20 wherein said sources includes means for providing respective mixtures of one or more reactant gas species to said inductor housings.

22. The apparatus of claim 21 wherein said substrate includes a plurality of substrate components, each said substrate component having a major surface including a semiconductor layer and wherein said reactant gas beams are substantially coincident on the major surfaces of said substrate components.

23. The apparatus of claim 20 or 21 further comprising means for conditioning said reactant gas species whereby the reactivity of at least a portion of said reactant gas species is enhanced with respect to said semiconductor layer.

24. The apparatus of claim 23 wherein said means for conditioning excites, dissociates and ionizes said reactant gas species to provide excited particles, radicals or ions, or combinations thereof.

25. The apparatus of claim 24 wherein said means for conditioning conditions said reactant gas species in said inductor housings.

26. The apparatus of claim 24 wherein said means for conditioning conditions said reactant gas species in said reactant gas beams.

27. The apparatus of claim 18 wherein each said microchannel plate has an inductor and an emitter surface, wherein each said microchannel plate comprises a plurality of channels extending therethrough at a respective angle of less than about 20° off normal to said emitter surface, wherein each said channel includes a nozzle and wherein said reactant gas beams are incident on said substrate at an angle of less than about 45° off normal to the major surface of said substrate.

28. The apparatus of claim 27 further comprising a plurality of inductor housings respectively coupled to said sources for receiving said reactant gas species, each said inductor housing forming a chamber over a respective said inductor surface.

29. The apparatus of claim 28 wherein said sources include means for providing respective mixtures of one or more reactant gas species to said inductor housings.

30. The apparatus of claim 29 wherein said substrate includes a plurality of substrate components, each said substrate component having a major surface including a semiconductor layer and wherein said reactant gas beams are substantially coincident on the major surfaces of said substrate components.

31. The apparatus of claim 28 or 29 further comprising means for conditioning said reactant gas species whereby the reactivity of at least a portion of said reactant gas species is enhanced with respect to said semiconductor layer.

32. The apparatus of claim 31 wherein said means for conditioning excites, dissociates and ionizes said reactant gas species to provide excited particles, radicals or ions, or combinations thereof.

33. The apparatus of claim 32 wherein said means for conditioning conditions said reactant gas species in said inductor housings.

34. The apparatus of claim 33 wherein said means for conditioning conditions said reactant gas species in said reactant gas beams.

35. Apparatus for providing a directionalized, large cross-sectional area reactant gas beam, said apparatus comprising:
   (a) a source of a reactant gas species;
   (b) a substrate having at least a layer of semiconductor material for the fabrication of semiconductor devices, said layer generally associated with a major surface of said substrate;
   (c) a microchannel plate for receiving said reactant gas species from said source and providing said reactant gas beam, said microchannel plate having inductor and emitter surfaces and including a plurality of closely packed, parallel aligned microchannels extending through said plate substantially perpendicular to said emitter surface of said plate, each such microchannel defining a substantially cylindrical opening extending through said plate and having a ratio of the length of each said microchannel to the mean diameter of the substantially cylindrical openings being between about forty and fifty with an average center to center spacing of said microchannels being within one order of magnitude greater than the mean cylindrical opening diameter of said microchannels;
   (d) a mount for positioning said substrate such that said reactant gas beam is directed onto said major surface of said substrate;
   (e) pumping means for maintaining a vacuum in the vicinity of said microchannel plate and the major surface of said substrate of less than about $5 \times 10^{-5}$ Torr such that said reactant gas species transits from said microchannel plate to said major surface with negligible inter-species collisions; and
   (f) an inductor housing connected to said source for conducting said reactant gas species from said source to said inductor surface, said inductor housing including a pressure valve in-line between said inductor housing and said source for controlling the pressure of said reactant gas species within said inductor housing, the pressure of said reactant gas species being controlled such that the means free path of said reactant gas species within said inductor housing is longer than the mean diameter of the substantially cylindrical openings at the inductor surface ends of each said microchannel.

36. Apparatus for providing a directionalized, large cross-sectional area reactant gas beam, said apparatus comprising:
   (a) a source of a reactant gas species;
   (b) a substrate having at least a layer of semiconductor material for the fabrication of semiconductor devices, said layer generally associated with a major surface of said substrate;
   (c) a microchannel plate for receiving said reactant gas species from said source and providing said reactant gas beam, said microchannel plate having inductor and emitter surfaces and including a plurality of closely packed, parallel aligned microchannels extending through said plate substantially perpendicular to said emitter surface of said plate, each such microchannel defining a substantially cylindrical opening extending through said plate and having a ratio of the length of each said microchannel to the mean diameter of the substantially cylindrical openings being between about ten and fifty, said microchannels having respective supersonic profile nozzles at the emitter surface ends thereof, said supersonic profile nozzles directionalizing the expansion of said reactant gas as it is emitted through said microchannel plate;
   (d) a mount for positioning said substrate such that said reactant gas beam is directed onto said major surface of said substrate;
   (e) pumping means for maintaining a vacuum in the vicinity of said microchannel plate and the major surface of said substrate of less than about $5 \times 10^{-5}$ Torr such that said reactant gas species transits from said microchannel plate to said major surface with negligible inter-species collisions; and
   (f) an inductor housing connected to said source for conducting said reactant gas species from said source to said inductor surface, said inductor housing including a pressure valve in-line between said inductor housing and said source for controlling the pressure of said reactant gas species within said inductor housing, the pressure of said reactant gas species being controlled such that said reactant gas species expands from said supersonic profile nozzles with the random motion of said reactant gas species associated with temperature being converted to high translational energy directed along the cylinder axis of said microchannels.

* * * * *

UNITED STATES PATENT AND TRADEMARK OFFICE
CERTIFICATE OF CORRECTION

PATENT NO. : 4,774,416

DATED : September 27, 1988

INVENTOR(S) : Askary, et al.

It is certified that error appears in the above-identified patent and that said Letters Patent is hereby corrected as shown below:

Column 6, line 60: (IN EQUATION 2)

"$D \, a \, \frac{d}{L}$" should be "$D \propto \frac{d}{L}$"

Column 6, line 62: "thus," should be "Thus"

Column 9, line 23: "nozzles 50" should be "nozzles 62"

Column 9, line 25: "nozzle 50" should be "nozzle 62"

CLAIMS

Colunm 14, line 8: "the means free" should be "the mean free" (Claim 35)

Signed and Sealed this

Thirteenth Day of June, 1989

Attest:

DONALD J. QUIGG

Attesting Officer     Commissioner of Patents and Trademarks